US006986004B1

(12) United States Patent
Cheng et al.

(10) Patent No.: US 6,986,004 B1
(45) Date of Patent: Jan. 10, 2006

(54) FIFO MEMORY WITH PROGRAMMABLE DATA PORT WIDTHS

(75) Inventors: Chan-Chi Jason Cheng, Fremont, CA (US); Bradley Felton, Chippenham (GB); Satwant Singh, Fremont, CA (US); Andrew Armitage, Chippenham (GB)

(73) Assignee: Lattice Semiconductor Corporation, Hillsboro, OR (US)

( * ) Notice: Subject to any disclaimer, the term of this patent is extended or adjusted under 35 U.S.C. 154(b) by 280 days.

(21) Appl. No.: 10/409,543

(22) Filed: Apr. 8, 2003

Related U.S. Application Data

(63) Continuation-in-part of application No. 10/133,106, filed on Apr. 26, 2002, now Pat. No. 6,765,408.

(60) Provisional application No. 60/356,507, filed on Feb. 11, 2002.

(51) Int. Cl.
*G06F 12/00* (2006.01)

(52) U.S. Cl. .................. 711/149; 711/101; 711/212; 711/154

(58) Field of Classification Search ................. 326/41; 711/131, 212
See application file for complete search history.

(56) References Cited

U.S. PATENT DOCUMENTS 4,891,788 A * 1/1990 Kreifels ....................... 365/49
5,715,197 A * 2/1998 Nance et al. ........... 365/189.02

OTHER PUBLICATIONS

Ron White and Timothy Downs, "How Computers Work," 2004 Que Publishing, 7th edition, p. 51.*

* cited by examiner

*Primary Examiner*—Donald Sparks
*Assistant Examiner*—Jesse Diller
(74) *Attorney, Agent, or Firm*—Jonathan W. Hallman; MacPherson Kwok Chen & Heid LLP

(57) ABSTRACT

A memory provides a programmable write port data width and an independently programmable read port data width. The independence between the programmable write port data width and the programmable read port data width is achieved without the use of a third clock domain.

18 Claims, 15 Drawing Sheets

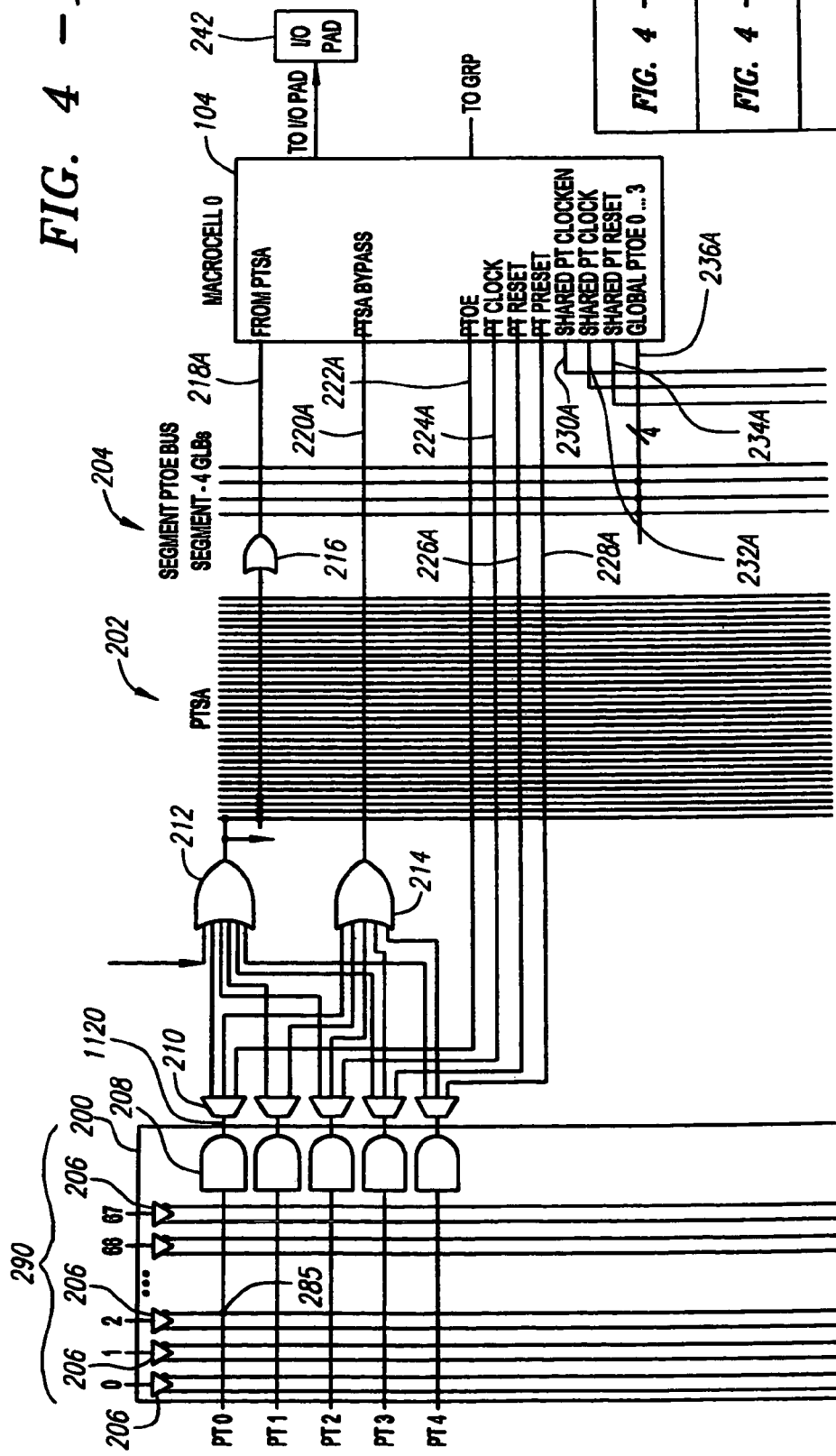

FIFO MEMORY WITH PROGRAMMABLE DATA PORT WIDTHS

RELATED APPLICATION DATA

This patent application is a continuation-in-part of co-owned U.S. application Ser. No. 10/133,106, filed Apr. 26, 2002, now U.S. Pat. No. 6,765,408, which is hereby incorporated by reference in its entirety, that in turn claims the benefit of co-owned U.S. Provisional Patent Application No. 60/356,507, filed Feb. 11, 2002, which is hereby incorporated by reference in its entirety.

INCORPORATION BY REFERENCE

The following co-assigned U.S. patent applications and patents are hereby incorporated by reference in their entireties: (1) U.S. Pat. No. 6,507,212, entitled "Wide Input Programmable Logic System And Method" filed on Nov. 2, 2000; and (2) U.S. Pat. No. 6,067,252, entitled "Electrically Erasable Non-Volatile Memory Cell With Virtually No Power Dissipation" filed on May 26, 1999.

TECHNICAL FIELD

The present invention relates generally to memories and programmable devices. Specifically, the present invention relates to a memory having independently programmable write port and read port data widths that may be implemented in a programmable AND array.

BACKGROUND

First-in-first-out (FIFO) memories permit a user to synchronize communication between two different clock domains. Data words enter a FIFO memory through a write port synchronized to a write clock. Retrieved data words from the FIFO memory leave the FIFO memory through a read port synchronized to a read clock. In a conventional FIFO memory, the data words have the same width (number of bits in each word) at both the read and write ports. Should all the deposited data have been retrieved through the read port, the FIFO memory asserts an empty flag to prevent further read operations. Conversely, should all memory locations in the FIFO memory contain un-retrieved data words, the FIFO memory asserts a full flag to prevent further write operations.

Although the read and write ports of a conventional FIFO memories are generally the same width, they may be adapted to accommodate read and write ports of differing data widths. For example, a user may write 8-bit words into a FIFO memory and read 32-bit words from this same FIFO memory. Such use of a FIFO memory has proven to be problematic because each FIFO memory typically has a predetermined width, i.e., it is configured to store words of a given number of bits. For instance, consider as shown in FIG. 1 a FIFO memory 10 having a read port data width and a write port data width of 32 bits being used to coordinate communication between a write domain of 8-bit words and a read domain of 32 bits words. Given that FIFO memory 10 has a 32-bit read and write port data width, four 8-bit words received at FIFO memory 10 must be packaged into a single 32-bit word before they can be written into FIFO memory 10. To accommodate this packaging, four 8-bit registers 15 store the in-coming 8-bit words as controlled by a 1:4 de-multiplexer 20. Control logic 24 controls 1:4 de-multiplexer 20 to load registers 15 in the correct order. The FIFO memory write port (illustrated as four 8-bit ports 32) must then receive data words at 1/4 the rate of the write clock 25. This 1/4 write clock rate creates a third clock domain 35 for FIFO memory 10 in addition to the conventional write clock 25 and read clock 30. The requirement of this third clock domain complicates the design and implementation and slows performance of the resulting FIFO memory. In particular, additional programmable logic is usually necessary to coordinate flag generation, write counting and decoding, thereby increasing cost and complexity of the resulting FIFO memory.

SUMMARY

In accordance with one aspect of the invention, a memory array has a write port and a read port. The memory array includes a means for writing words of a first programmable width into the write port and a means for reading words of a second programmable width from the read port.

In accordance with another aspect of the invention, a memory array includes dual ports, wherein each port is configurable as both a read port and a write port. The memory array includes a means for writing words of a first programmable width into either of the ports and a means for reading words of a second programmable width from either of the ports.

In accordance with another aspect of the invention, a first-in-first-out (FIFO) memory includes a memory array which stores and retrieves data words according to the first-in-first-out hierarchy. A write counter is configured to increment a write count according to a programmable write port data width such that the write count corresponds to a current write address in the memory array. The write counter increments the write count responsive to a write clock. A read counter is configured to increment a read count according to a programmable read port data width such that the read count corresponds to a current read address in the memory array. The read counter increments the read count responsive to a read clock.

Another aspect of the invention relates to programmable block having a plurality of product term circuits. Each product term circuit is configured to provide a product term output based upon a subset of inputs selected from a set of input signals. A plurality of memory cells are arranged corresponding to the set of input signals within each product term circuit such that each memory cell controls whether its corresponding input signal will affect the product term output. A subset of the product term circuits are configurable in a FIFO mode to form a FIFO memory such that the product term output from each of the product term circuits in the subset corresponds to a bit stored in one of its memory cells. A write counter is configured to increment a write count according to a programmable write port data width such that the write count corresponds to a current write address in the FIFO memory. The write counter increments the write count responsive to a write clock. A read counter is configured to increment a read count according to a programmable read port data width such that the read count corresponds to a current read address in the FIFO memory. The read counter increments the read count responsive to a read clock

BRIEF DESCRIPTION OF THE DRAWINGS

Use of the same reference symbols in different figures indicates similar or identical items.

DETAILED DESCRIPTION

The present invention provides a memory array having write and read interfaces whose data widths may be configured independently of one another. The capability of a memory array to have its read and write port data widths independently configured may be denoted as "data rate adaptation" in that such a memory could accommodate the transfer of data from one width to another as desired by a user. The memory array may be a pseudo-dual port RAM (entitled "pseudo-dual port" because the are two independent ports wherein one port is a dedicated read port and the other is a dedicated write port), dual port RAM (in contrast to pseudo-dual port RAM, each port may be either or read or a write port), or a FIFO memory as will be explained herein. The FIFO memory embodiment will be discussed first.

Figure 1:
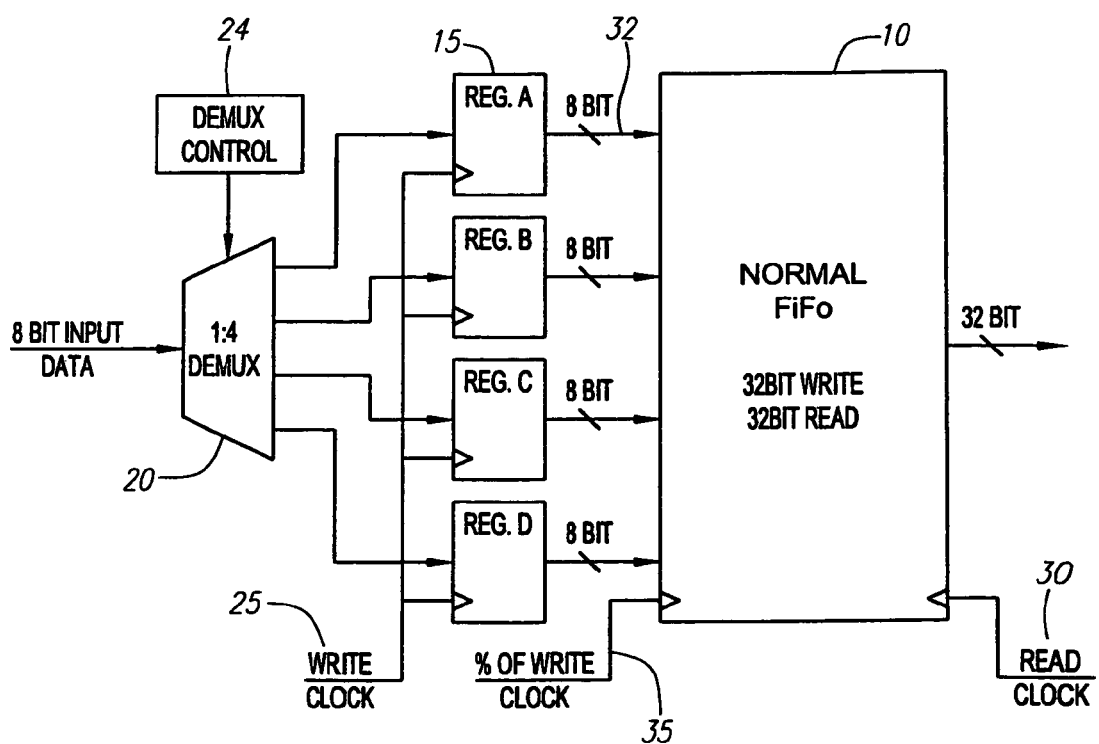
FIG. 1 is a block diagram of a conventional FIFO memory having a fixed read port data width and write port data width.
Figure 2:
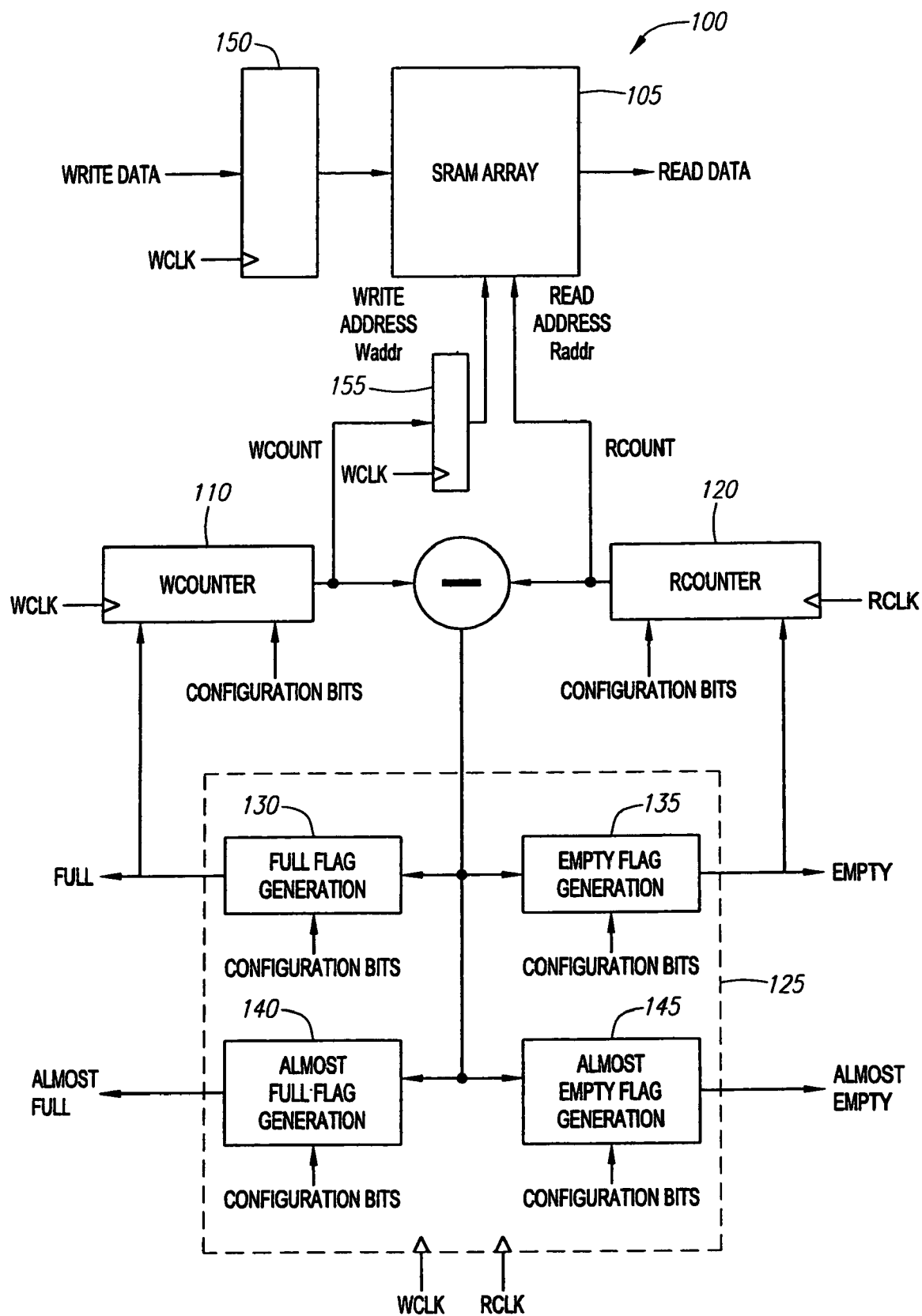
FIG. 2 is a block diagram of a FIFO memory having programmable read port and write port data widths according to one embodiment of the invention.

Turning now to FIG. 2, a FIFO memory 100 includes a memory array such as SRAM array 105. SRAM array 105 may be of any desired size, for example, it may have a total of 16K SRAM memory cells (such as SRAM cells 1140 discussed below with respect to FIG. 5) configurable to store, for example, 512 32-bit data words or 1024 16-bit data words. The size of SRAM array 105 in turn drives the maximum count for write counter 110 and read counter 120. For example, if SRAM array 105 has a total of 16K SRAM memory cells, write counter 110 and read counter 120 both count to 32K (15 bit counts) to allow a wrap-around count through the SRAM array 105. This wrap-around feature, for example, allows the write count (denoted as WCOUNT in FIG. 2) to "lap" the read count (denoted as RCOUNT in FIG. 2). In other words, should RCOUNT be, e.g., 1024, WCOUNT may be 16K (writing through the whole SRAM array 105) plus 512 (the "wrap around" value) but there would still be room for additional writes. In this fashion, both write counter 110 and read counter 120 count modulo 2N, wherein N is the bit size of SRAM array 105.

To provide data rate adaptation, write counter 110 and read counter 120 increment their counts corresponding to their respective data widths. For example, if the write data width is 8 bits, write counter 110 increments WCOUNT in 8 bit increments such that WCOUNT counts as 0, 8, 16, 32, and so on. Similarly, if the read data width is 32 bits, read counter 120 increments RCOUNT in 32 bit increments such that RCOUNT counts as 0, 32, 64, 128, and so on. Configuration signals control the incrementing by write counter 110 and read counter 120 according to the desired data widths. Write counter 110 increments WCOUNT responsive to cycles of the write clock (denoted as WCLK). Similarly, read counter 120 increments RCOUNT responsive to cycles of the read clock (denoted as RCLK).

Decoders (not illustrated in FIG. 2 but described with respect to FIG. 7) decode WCOUNT and RCOUNT to identify the current write address and current read address in SRAM array 105 as is known in the art. To synchronize the receipt of words with the appropriate write count (and thus the current write address), incoming data words and the WCOUNT may be registered synchronously with WCLK in registers 150 and 155, respectively.

Although write counter 110 will normally increment WCOUNT at each cycle of WCLK, SRAM array 105 can only store a finite number of data words. Thus, write counter 110 should be disabled from incrementing WCOUNT when SRAM array 105 is full. Similarly, read counter 120 should be disabled from incrementing RCOUNT when SRAM array 105 is empty. To provide this incremental control, a flag generation module 125 receives the difference between WCOUNT and RCOUNT and generates a full flag and an empty flag accordingly. Write counter 110 receives the full flag and will not increment WCOUNT when the full flag is asserted by flag generation module 125. Similarly, read counter 120 receives the empty flag and will not increment RCOUNT when the empty flag is asserted by flag generation module 125.

Flag generation module 125 may be functionally divided into a full flag generation module 130 and an empty flag generation module 135. Each module 130 and 135 performs a magnitude comparison having the same number of bits as used in write counter 110 and read counter 120. In turn, this bit size is driven by the size of the SRAM array 105 as discussed previously. Thus, should SRAM array 105 have a total of 16K memory cells, the magnitude comparison in full flag generation module 130 and empty flag generation module 135 may each be 15 bits. The empty flag state is driven by the read port data width (i.e., the number of bits in the data words being retrieved from SRAM array 105. For example, if the read port data width is 32 bits, WCOUNT (the write count) must be at least 32 bits ahead of RCOUNT (the read count). Otherwise, there would not be a 32 bit data word available in SRAM array 105 that may be retrieved. Thus, if the difference between the write count and the read count is less than the read data port width, the empty flag is asserted (indicating that no data words are available for retrieval. If the difference between the write count and the read count is greater than or equal to the write port data width, the empty flag is de-asserted (indicating that data words may be retrieved). The following table demonstrates an implementation of the empty flag generation algorithm for a 16K-bit FIFO memory having a write port data width of 8 bits and a read port data width of 32 bits:

| WCOUNT | RCOUNT | Difference | Empty Flag |
|---|---|---|---|
| 0 | 0 | 0 | Asserted |
| 8 | 0 | 8 | Asserted |
| 16 | 0 | 16 | Asserted |
| 24 | 0 | 24 | Asserted |
| 32 | 0 | 32 | Not asserted |
| 40 | 0 | 40 | Not asserted |
| 48 | 0 | 48 | Not asserted |
| 56 | 0 | 56 | Not asserted |
| 64 | 0 | 64 | Not asserted |
| 72 | 0 | 72 | Not asserted |
| 80 | 0 | 80 | Not asserted |
| 80 | 32 | 48 | Not asserted |
| 80 | 64 | 16 | Asserted |
| 88 | 64 | 24 | Asserted |
| 96 | 64 | 32 | Not asserted |
| 96 | 96 | 0 | Asserted |

Similarly, the state of the full flag is driven by the write port data width. The difference between the write count (WCOUNT) and the read count (RCOUNT) cannot exceed the total bit size of the SRAM array 105 minus the write port data width or there will be no room to write any additional data words into SRAM array 105. If, however, the difference between the write count and the read count is less than or equal to the total bit size minus the write port data width, SRAM array 105 has room to receive at least one additional data word. Just as with empty flag generation module 135, full flag generation module 130 is programmable through configuration signals to indicate the desired write port data width. The following table demonstrates an implementation of the full flag generation algorithm for a 16K-bit FIFO memory having a write port data width of 8 bits and a read port data width of 32 bits:

| WCOUNT | RCOUNT | Difference | Full Flag |
|---|---|---|---|
| 16360 | 0 | 16360 | Not asserted |
| 16368 | 0 | 16368 | Not asserted |
| 16376 | 0 | 16376 | Not asserted |
| 16384 | 0 | 16384 | Asserted |
| 16384 | 32 | 16352 | Not asserted |

The above-described full flag generation algorithm assumes a user wants to store the maximum possible number of data words in the FIFO memory. However, a user may program the full flag generation module to assert the full flag when the difference between the write count and read count is substantially less than the total bit size of the SRAM array 105 minus the write port data width, thereby storing less than the maximum possible number of data words in the FIFO memory. Similarly, the empty flag generation module may be programmed to assert the empty flag even though words that may be read are stored within the FIFO memory.

The generation of the almost full flag and almost empty flag occurs analogously to their full and empty flag counterparts in almost full flag generation module 140 and almost empty flag generation module 145, respectively. The definition of "almost empty" depends upon how many data words FIFO memory 100 is storing before a user wants to declare that the array is "almost empty." For example, a user may wish to assert the almost empty flag when just a single data word may be retrieved from FIFO memory 100. In this case, almost empty flag generation module 145 will assert the almost empty flag when the difference between WCOUNT and RCOUNT is less than the sum of the read port data width plus an additional read port data width. Similarly, the definition of "almost full" depends upon how many additional data words FIFO memory 100 may store before a user wants to declare that the array is "almost full." For example, a user may wish to assert the almost full flag when FIFO memory 100 has room to store just one additional received data word. In this case, almost full generation module 140 will assert the almost full flag when the difference between WCOUNT and RCOUNT exceeds the value of (total FIFO memory capacity minus two times the write port data width).

It will be appreciated that FIFO memory 100 is thus fully programmable with respect to a desired write port data width and read port data width. This flexibility is achieved without the requirement of a third clock domain, which substantially simplifies the construction of the flag generation module 125.

Although the present invention may be implemented with any suitable memory array such as SRAM array 105, the following description applies to an embodiment of the invention in which the SRAM array also serves as the fuse points for a programmable AND array. In turn, each programmable AND array may form a programmable logic block. It follows that such an embodiment of the present invention may operate in a logic mode or a FIFO memory mode. The logic mode of operation will be described first.

Logic Mode

Figure 3:
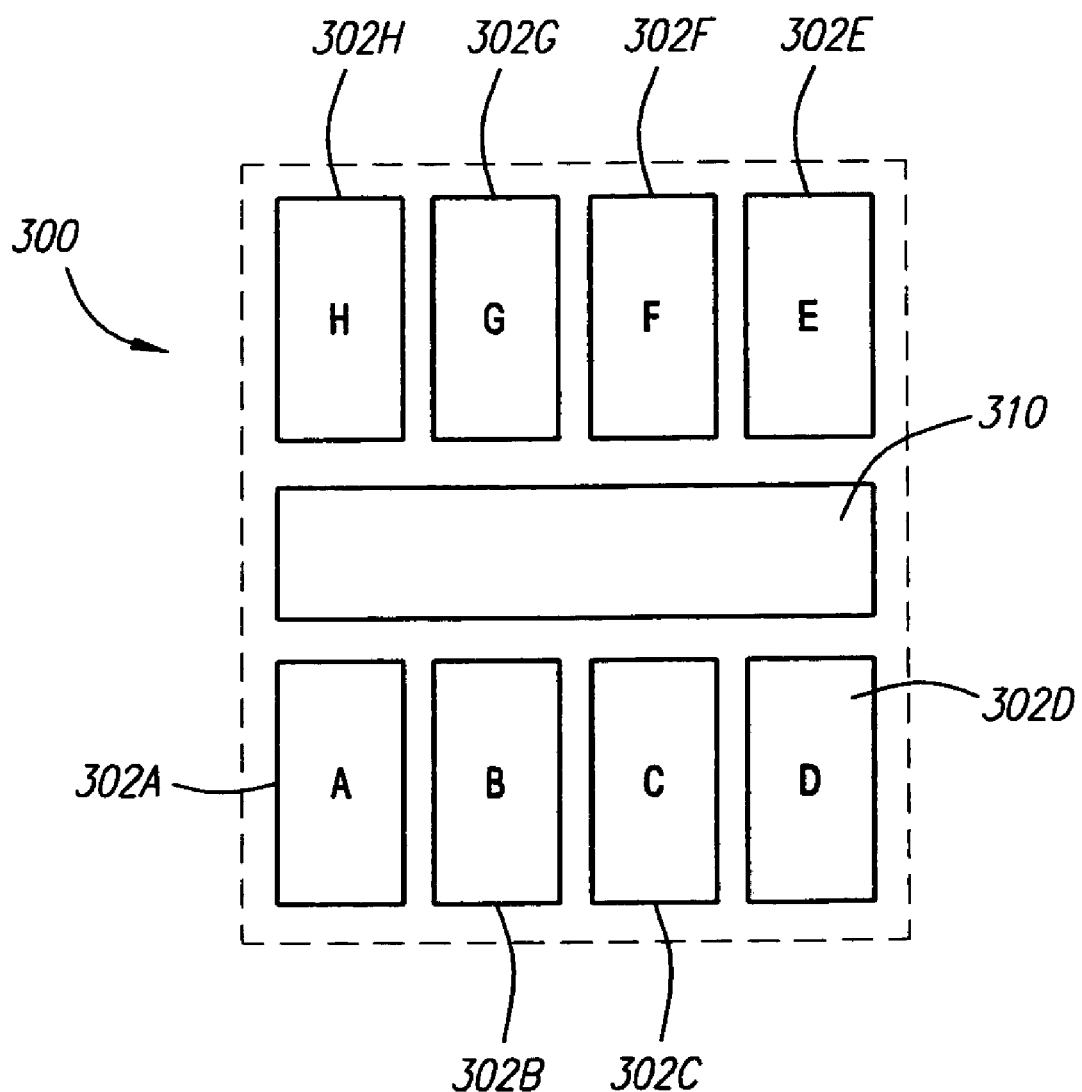
FIG. 3 illustrates one embodiment of a programmable device with a plurality of programmable logic blocks according to one embodiment of the invention.

FIG. 3 illustrates one embodiment of a programmable device 300 with a plurality of programmable logic blocks 302A–302H. Each programmable logic block 302A–302H comprises a plurality of product term circuits as will be described further herein. The programmable device 300 may be implemented on a single microchip. There are eight programmable logic blocks 302A–302H in FIG. 3, but other embodiments of the programmable device 300 may have any suitable number of programmable logic blocks, such as 16, 32, 64, 1000 or 10,000 programmable logic blocks. Also, the programmable logic blocks 302A–302H may be arranged in a number of different configurations.

In programmable device 300, the programmable logic blocks 302A–302H receive and transmit signals, such as data and control signals, via a routing structure 310. The device 300 may also have an isolated, non-volatile memory block (not illustrated), such as EEPROM, that transfers configuration signals and instructions to the programmable logic blocks 302A–302H upon power-up.

Each programmable logic block 302A–302H includes a plurality of product term circuits that form a programmable AND array. The product term output from each product term circuit is the product (the logical AND function) of one or more logical inputs selected from a set of possible logical inputs. The selection of the logical inputs used to form a product term output depends upon the desired logical function a user wants to implement. Based upon the desired logical function, fuse points within each product term circuit are activated to "fuse in" the required logical inputs. In the illustrated embodiment, each fuse point comprises a memory cell such as an SRAM memory cell; however, non-volatile memory cells may also be used. Configuration signals control the activation of the fuse points during logic mode operation as is known in the art.

In the present invention, the memory cells controlling the fuse points within each product term circuit may be used in a FIFO memory mode by fusing in only one logical input for a given product term circuit. In this fashion, a product term circuit may be used as part of a memory as will be explained in further detail herein.

Figures 2, 4:
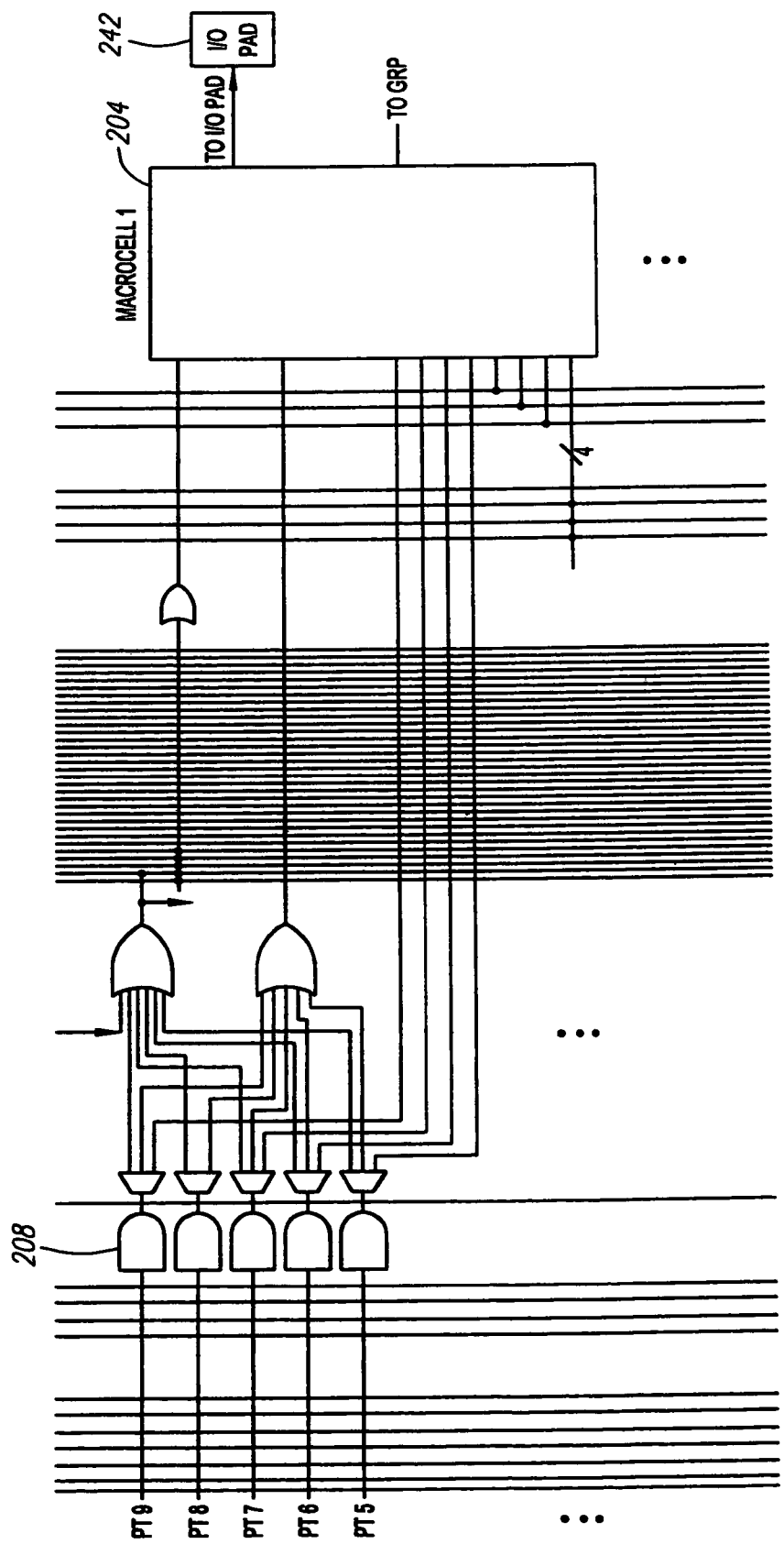
FIG. 4 is a block diagram for one of the programmable logic blocks shown in FIG. 3.
Figures 3, 4:
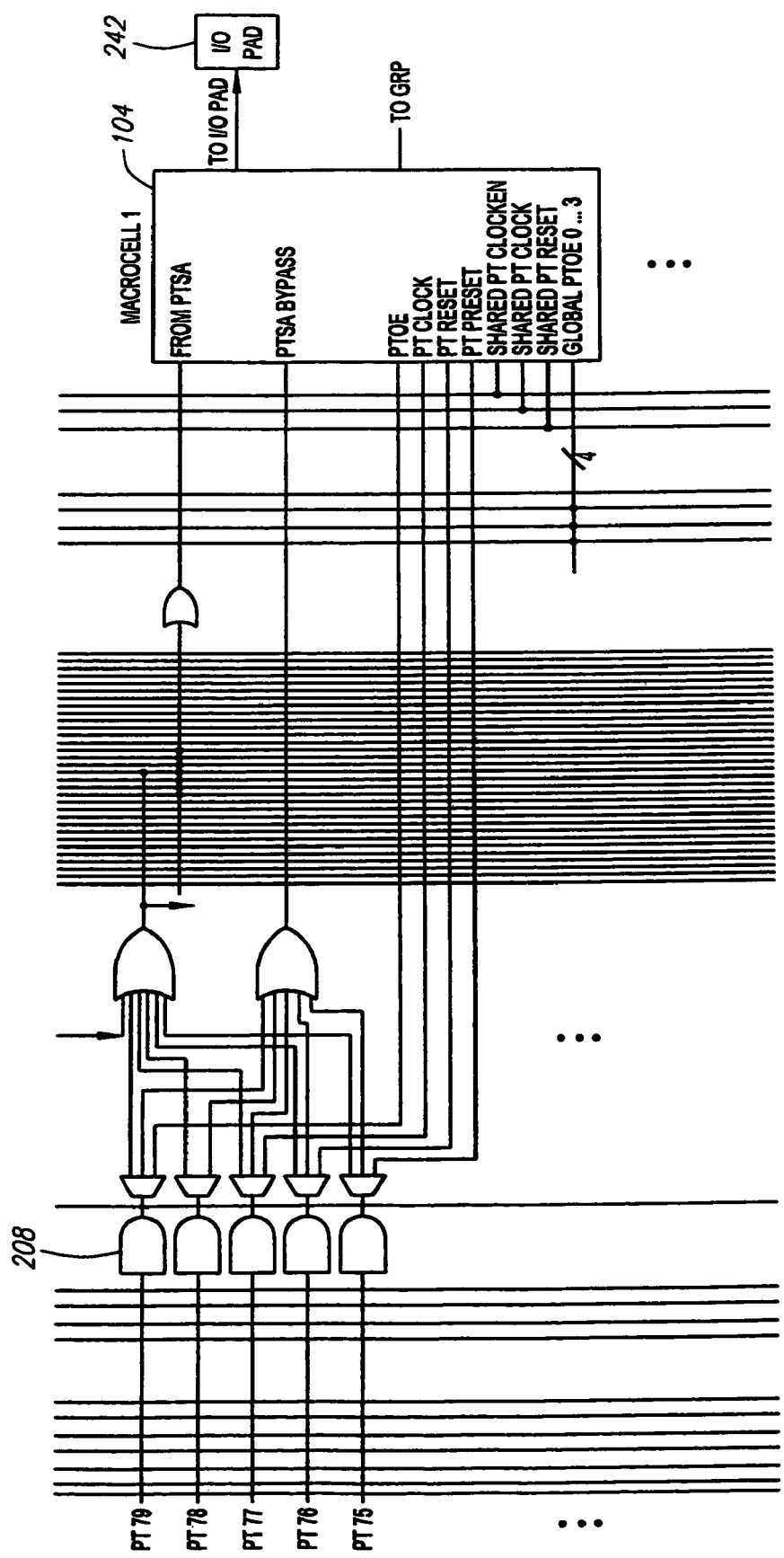
Figure 4:
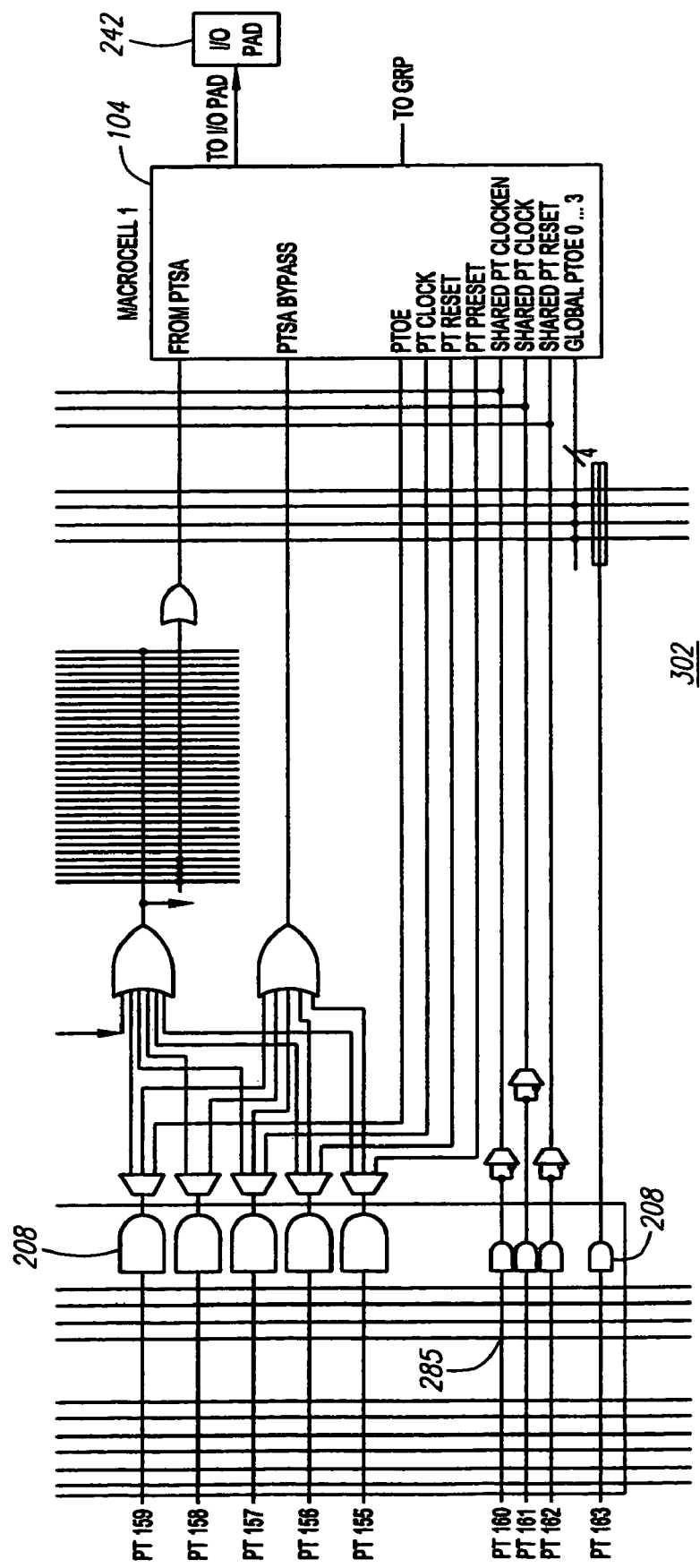

FIG. 4 illustrates one embodiment of a programmable logic block 302 of FIG. 3. Programmable logic block 302 includes a programmable AND array 200 comprising a plurality of product term circuits 208. Although each programmable logic block 302 may include any desired number of product term circuits 208, FIG. 4 illustrates an embodiment having 164 product term circuits 208. Each product term circuit 208 may receive 68 logical inputs 290 coupled from routing structure 310 (FIG. 3). However, the actual number of logical inputs 290 coupled into each programmable logic block 302 is not important and may be changed in alternative embodiments. Input ports 206 form the true and complement of each logical input 290. Thus, each product term circuit 208 may form the logical AND of up to 136 input variables. From these logical inputs, 164 product term outputs are provided by product term circuits 208, such that each product term output corresponds uniquely to its product term circuit 208. Each product term circuit 208 has fuse points 285 (discussed further below) corresponding to each of the available 136 inputs such that if a fuse point is activated, the corresponding input is selected. Accordingly, each product term circuit 208 includes 136 fuse points 285 for each of its 136 input variables.

Figure 5:
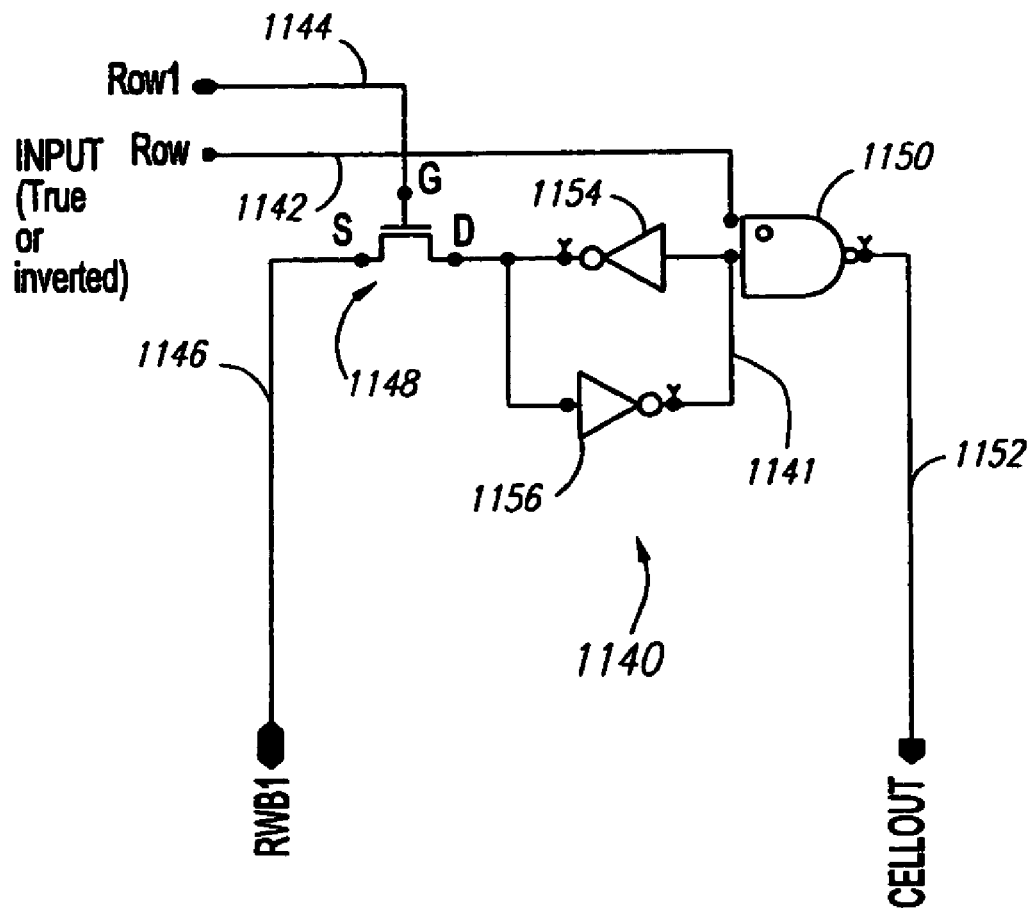
FIG. 5 illustrates one embodiment of an SRAM memory cell that may be used in the product term circuits within the programmable logic block of FIG. 4.
Figure 6A:
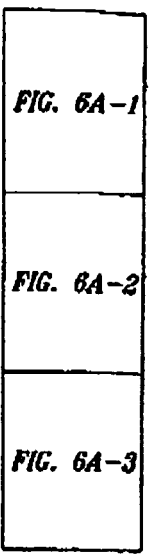
FIG. 6 illustrates one embodiment of tiered logic structure for use in the product term circuits of FIG. 4.
Figures 1, 6A:
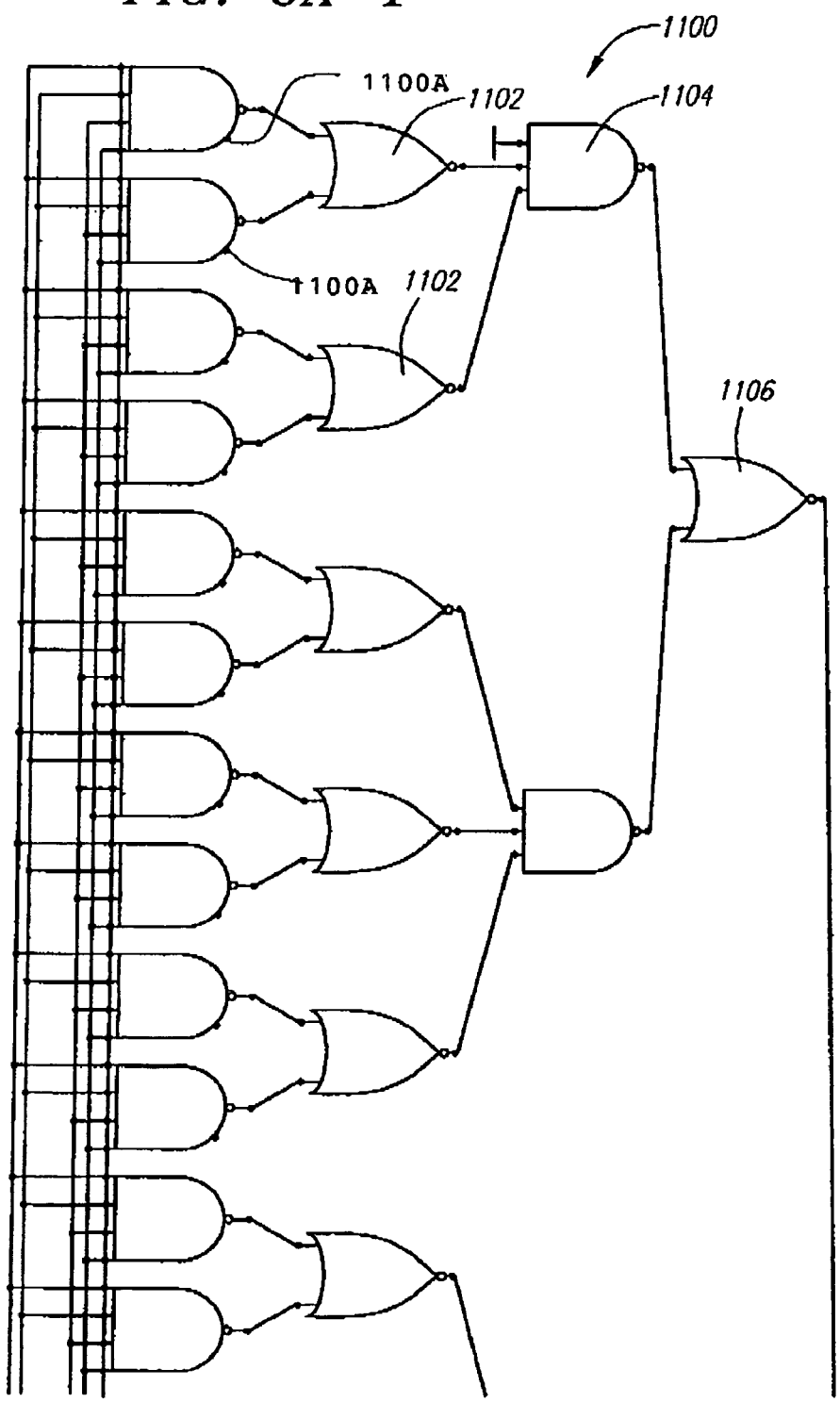
Figures 2, 6A:
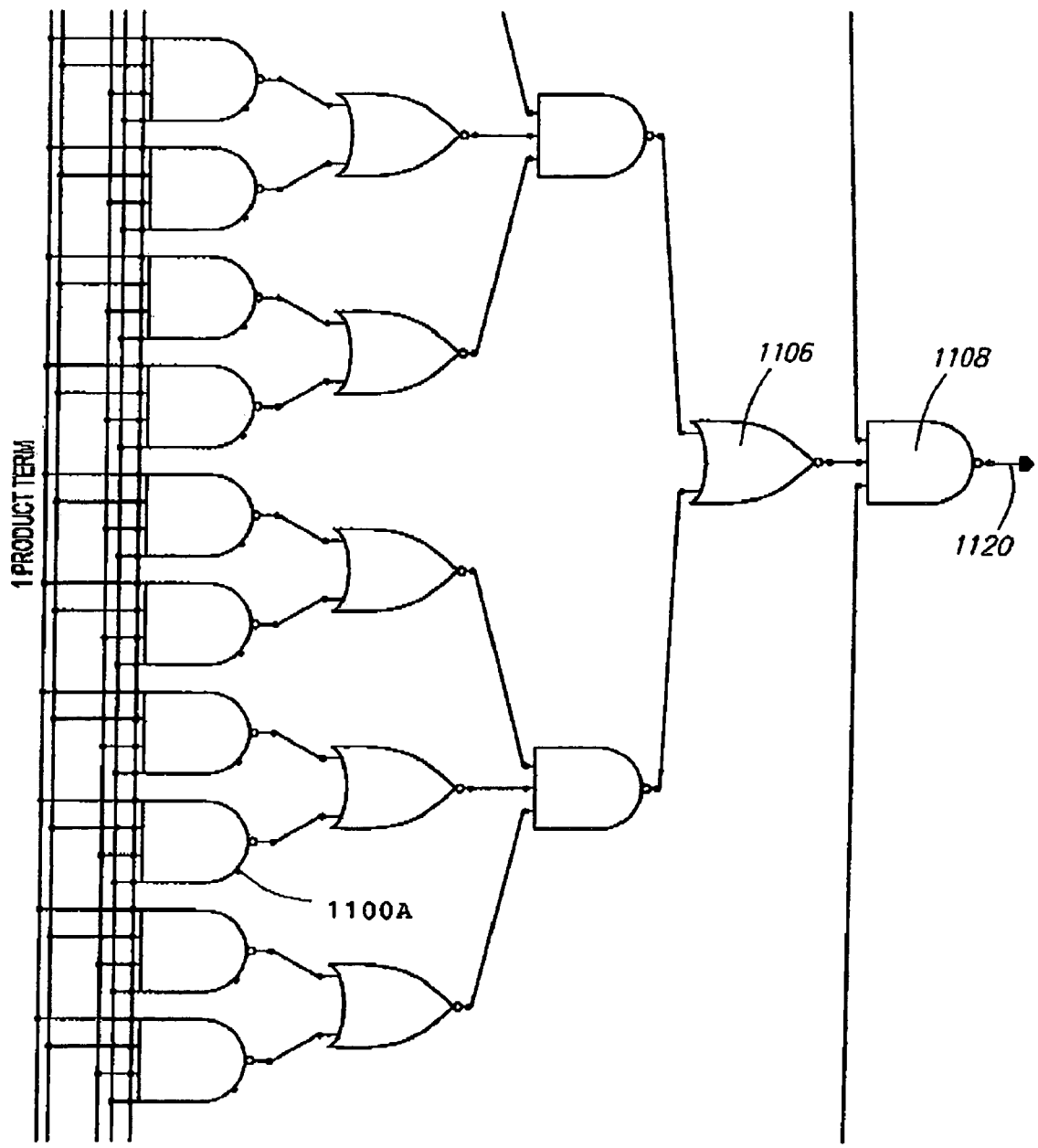
Figures 3, 6A:
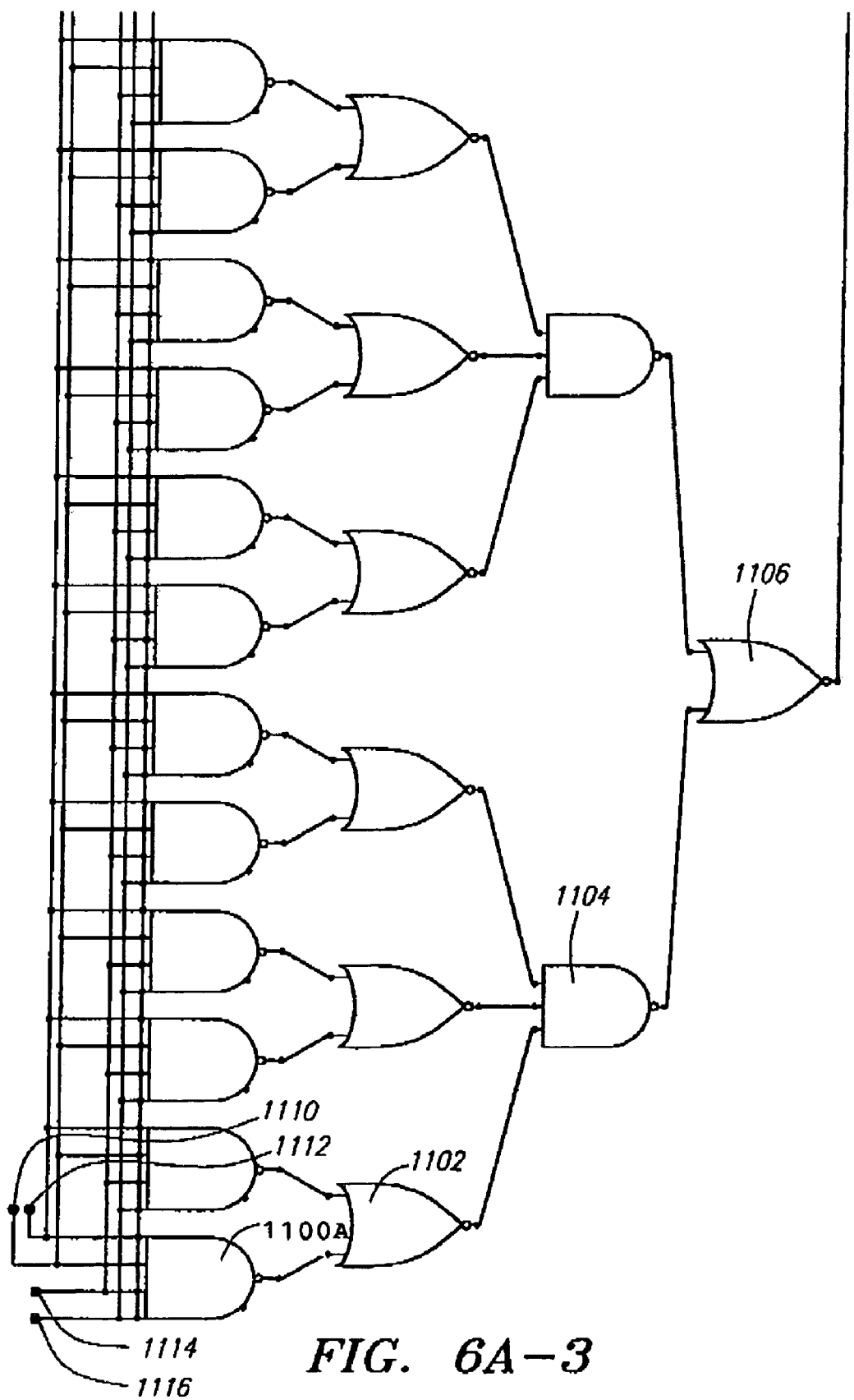

Referring to FIG. 5, a variety of SRAM cells such as SRAM cell 1140 or other type of memory cells may be used to implement the fuse points 285. SRAM cell 1140 may store a configuration bit using cross-coupled inverters 1156 and 1154. The "Q" output 1141 (which may also be denoted the fuse value 1141) of SRAM cell 1140 is received at NAND gate 1150, which also receives a logical input carried on line 1142. This logical input corresponds to one of the 136 variables coming from input ports 206 in FIG. 4. If fuse value 1141 is a logical one, NAND gate 1150 passes an inverted version of the logical input on line 1142 onto output line 1152. In this fashion, the logical input is "fused" onto output line 1152 such that SRAM cell 1140 forms a fuse point that controls whether its corresponding logical input can affect the product term output. Because each product term output is the logical AND of whatever number of logical inputs are fused in (from the possible set of 136 inputs), each product term circuit 208 processes up to 136 logical input variables carried on 136 input lines 1142.

The SRAM cells 1140 for each of the product term circuits 208 may be arranged in rows and columns such that if a given SRAM cell's word line 1144 is held high, SRAM cell 1140 will store the inverse of whatever logical state its bit line 1146 is in. In turn, the activation of the word lines 1144 and bit lines 1146 may be controlled by configuration signals coupled from a non-volatile configuration memory (not illustrated) such as an EEPROM. The EEPROM may be programmed in an EEPROM programming mode or an EEPROM write mode as is known in the art. The EEPROM cells storing the configuration signals may be "zero power" memory cells that consume substantially zero DC current during configuration and erasure as described in (1) U.S. Pat. No. 6,507,212, entitled 'Wide Input Programmable Logic System And Method,' which was filed on Nov. 2, 2000 by the Assignee of the present Application, and (2) U.S. Pat. No. 6,067,252, entitled 'Electrically Erasable Non-Volatile Memory Cell With Virtually No Power Dissipation,' which was filed on May 26, 1999' by the Assignee of the present application.

Once all the applicable logical variables have been fused in for a given product term circuit 208, the corresponding product term output may be formed using a sense amplifier as is known in the art. Alternatively, a tiered NAND-NOR logic structure such as described in U.S. Pat. No. 6,507,212 may be used to form the product term output. FIG. 6 illustrates one embodiment of a tiered logic structure 1100 for forming a product term output 1120. Each first level "complex" NAND gate 1100A receives the true 1110 and complement values 1112 of a logical input 290 as produced by an input port 206 of FIG. 4. Similarly, each complex NAND gate 1100A receives the SRAM fuse values (the Q output 1141) corresponding to inputs 1110 and 1112. It will thus be appreciated that complex NAND gate 1100A is illustrated for functional purposes only. To permit the individual fusing of each input 1110 and 1112, complex NAND gate 1100A could be implemented by, for example, two NAND gates 1150 of FIG. 5, where one NAND gate 1150 receives the true input (on line 1142) and the other receives the complement input 1112 (on line 1142). The outputs 1152 from each NAND gate 1150 could then be processed by a NAND gate (not illustrated) to form the output of complex NAND gate 1100A. Note that if an actual (rather than "complex") NAND gate was used in place of complex NAND gate 1100A, individual fusing could not be accomplished because the fuse signal 1141 for the true input 1110 would control whether the complement input 1112 could be fused in and vice versa.

Additional tiers of logic formed by NOR gates 1102, NAND gates 1104, NOR gates 1106, and NAND gate 1108 complete the tiered logic structure 1100, which produces product term output 1120. It will be appreciated that these logic gates (as opposed to complex NAND gates 1100A) are conventional logic gates because the fusing has already been accommodated by complex NAND gates 1100A.

Each product term circuit 208 thus includes the fuse points 285 and the structure necessary to form the AND of whatever inputs are fused in. For example, a product term circuit 208 may include 136 SRAM cells 1140 to provide up to 136 inputs on lines 1112, whose logical AND (product term) 1120 is produced by the tiered logic structure 1100 discussed with respect to FIG. 6. It will also be appreciated that other types of structures may be used to form the AND of the fused-in logical inputs in a product term circuit such as a sense amplifier.

Referring back to FIG. 4, a plurality of macrocells 104 may register various sums of product term outputs 1120 from the product term circuits 208. For example, each macrocell 104 may receive the output of an OR gate 214. In turn, each OR gate 214 may form the sum of up to 5 product term outputs 1120 depending upon its configuration. Accordingly, each macrocell 104 corresponds to 5 product term circuits 208. In an embodiment having 32 macrocells 104, there would thus be 160 corresponding product term circuits 208. An additional 4 product term circuits 208 may be used to form control signals for the macrocells 104. To permit the option of processing wider input logic functions, each macrocell 104 may also receive a product term sharing output from a corresponding OR gate 212. In turn, the output from OR gate 212 may be fused into an output from a product term sharing array 202 that is also driven by the outputs of 6 other input OR gates 212. Each OR gate 212 may receive the 5 product term outputs discussed with respect to OR gate 214. In addition, OR gates 212 may receive an output from other macrocells 104. In this fashion, each macrocell 104 may register various sum of product term outputs depending upon the logical functions a user wishes to implement. It will be appreciated, however, that the manner each macrocell 104 may register various sum of product outputs is unimportant to the present invention. What is relevant to the present invention is that a programmable logic block 102 include product term circuits having fuse points as will be further explained with respect to the memory mode.

Memory Mode

Referring back to FIG. 4, each programmable AND array 200 includes a plurality of product term circuits 208. Each product term circuit 208 provides an AND of the selected inputs as its product term output (element 1120 in FIG. 6). As discussed earlier, should only one logical input be fused into a product term circuit 208, the product term output equals the logical input. Referring again to FIG. 5, if the input line 1142 is held high, it will allow Q output 1141 from SRAM cell 1140 to pass (inverted) through NAND gate 1150. If all remaining fuse points/SRAM cells 1140 in a given product term circuit 208 are de-activated and input line 1142 held high, the product term output 1120 (FIG. 6) will depend solely on the contents of the affected SRAM cell 1140. In this fashion, a product term circuit 208 may also be used as a memory, reflecting whatever bit value has been programmed into the relevant SRAM cell 1140 through bit line 1146. By combining multiple numbers of product term outputs, data words may be retrieved from an SRAM array forming the fuse points for a set of product term circuits 208.

Figure 7:
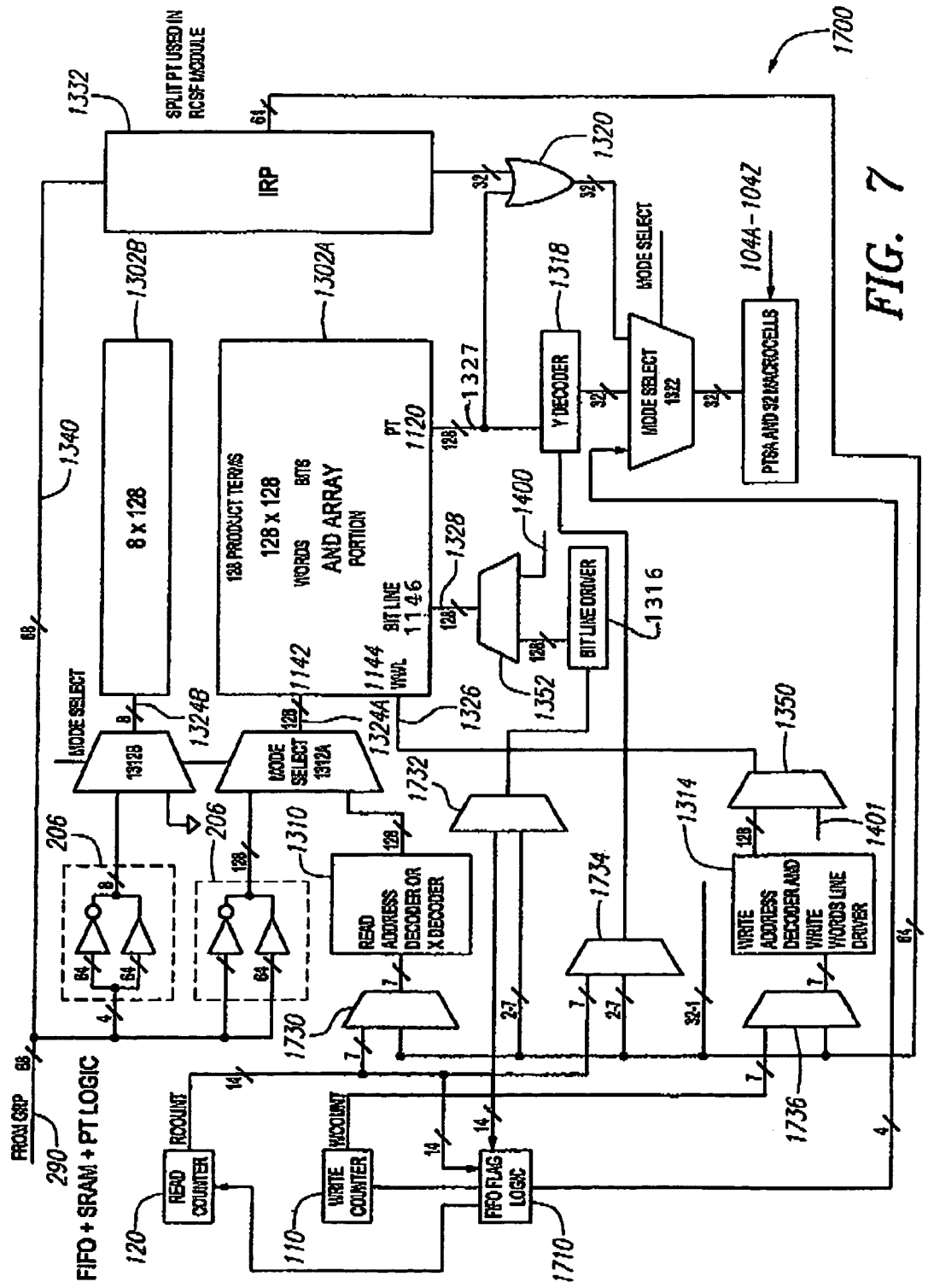
FIG. 7 illustrates a partitioning of the product term circuits in the programmable logic block of FIG. 4 to implement a FIFO memory according to one embodiment of the invention.

Turning now to FIG. 7, product term circuits 208 within a programmable block 302 may be divided into an input routing pool (IRP) portion 1332 and a memory portion 1302A. The division is for functional purposes only in that the product term circuit 208 structure discussed with respect to FIG. 4 remains unchanged. For example, IRP portion 1332 may use 32 product term circuits 208 and memory portion 1302A may use 128 product term circuits 208 (out of the total product term circuits 208 contained within programmable AND array 200). As described above, each product term circuit 208 may have SRAM memory cells 1140 corresponding to possible logic variables that may affect its product term output 1120 (FIGS. 5 and 6). During logic mode, a plurality such as 68 logical inputs 290 may be coupled into each product term circuit 208 from routing structure 310. Input ports 206 form the true and complement of these logical variables giving a set of input variables twice the size of the set of logical inputs 290 of possible input variables. Each input variable in the set of input variables has a corresponding fuse point/SRAM cell 1140 in its product term circuit 208. Accordingly, if there are 68 logical inputs 290, the number of SRAM cells 1140 in each product term circuit 208 would be 136. Given that memory arrays are much easier to address and decode for if arranged in powers of two, 136 SRAM cells 1140 is an inconvenient number. Thus, memory portion 1302A may include a binary-based subset of SRAM cells such as 128 SRAM cells 1140 from each of its 128 product term circuits 208. The remaining 8 SRAM cells from each of the product term circuits 208 in memory portion 1302A may be functionally organized in logic portion 1302B. During logic mode, mode select circuits 1312A and 1312B select the outputs of input ports 206. However, during memory mode, mode select 1312A selects the output of a read address decoder 1310. Read address decoder provides a 128 bit word to activate word lines 1142 during the reading of a single bit from each relevant product term circuit 208 (those product term circuits 208 each storing a bit of the desired word).

Other mode select circuits operate in a similar fashion. For example, bit lines 1146 in memory portion 1302A receive configuration signals during logic mode as described previously. However, during memory operation, a mode select circuit 1352 selects for the output of a bit line driver 1316 that provides the data words to be written into memory portion 1302A. During logic mode operation, mode select circuit 1352 selects for configuration signals 1400. In memory mode operation, IRP 1332 provides the data bits forming these data words and the corresponding addresses as will be described further herein. Similarly, during logic mode operation, word lines 1144 in memory portion 1302A receive configuration signals 1401 as selected by a mode select circuit 1350. However, during memory mode operation, mode select circuit 1350 selects for the output of write address decoder 1314.

The memory mode may use SRAM array 1302A as either a FIFO memory or a RAM. During FIFO memory mode, Decoders 1310 and 1314 receive RCOUNT and WCOUNT, respectively as described with respect to FIG. 2. As will be explained further herein, WCLK, RCLK (FIG. 2) and the data signals used to drive bit lines 1146 are derived from signals coupled from routing structure 310 during FIFO memory mode operation. These signals may be coupled over the same bus carrying the logical variables 290 during logic mode operation. Unlike logical signals, the data signals and control signals such as WCLK and RCLK must be presented in the proper order so they may be routed to the proper module. In contrast, the order of logical variables is unimportant—the logical AND of variables A and B is the same as the logical AND of variables B and A. In the FIFO memory mode and RAM mode of operation, input routing pool 1332 provides the proper re-ordering of data signals and control signals coupled from routing structure 110. It will be appreciated that this re-ordering of variables may be performed by the routing structure 310 itself. However, the present invention relieves this added burden on the routing structure by re-use of the product term circuits 208 within IRP portion 1332 as follows.

Figure 8:
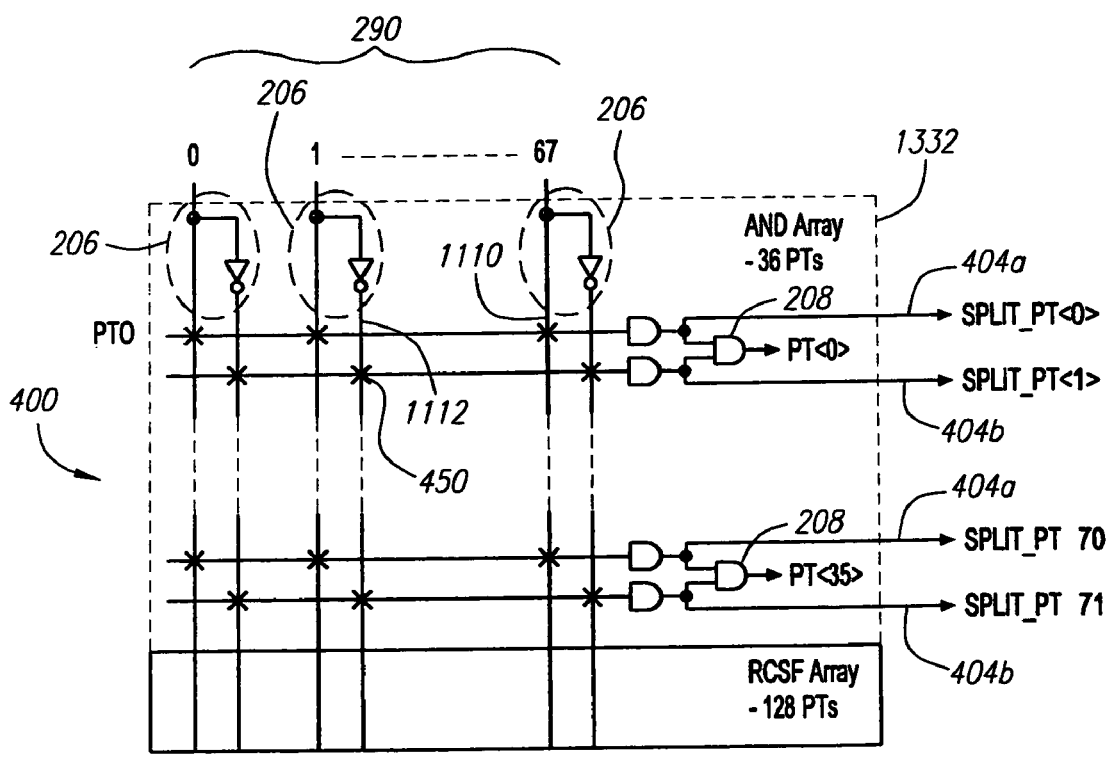
FIG. 8 illustrates one embodiment of a split-AND array to implement the input routing pool shown in FIG. 7.

Each product term circuit 208 within IRP portion 1332 may be "split" to provide split product term outputs 404a and 404b as illustrated in FIG. 8. Whereas both the true and complement of a logical input 290 may be fused in to affect a product term output as discussed above with respect to FIG. 4, split product term 404A is the logical AND of just the true inputs 1110 (discussed with respect to FIG. 6) and split product term 404b is the logical AND of the complement logical inputs 1112 (also discussed with respect to FIG. 6). Just as with the FIFO memory portion 1302A, each split product term 404 from IRP portion 1332 results from the activation of just one fuse point 285 during switch mode operation. Thus, each split product term 404 is the AND of only a single input variable. In this fashion, IRP 1332 may reorder inputs without changing their values. By splitting the product term outputs, the number of product term circuits 208 used to form IRP 1332 is reduced because each product term circuit 208 provides two outputs in a split product term mode. It will be appreciated, however, that the memory mode of the present invention may be practiced without the use of split product terms at the cost of using more product term circuits to perform the input re-ordering function of IRP 1332. Should IRP 1332 contain 36 product term circuits 208, a total of 72 split product terms 404 are available for re-ordering of data and control inputs. Alternatively, should IRP 1332 contain 32 product term circuits 208, a total of 64 split product terms 404 are available for re-ordering of data and control signals coupled from routing structure 310 during the FIFO memory mode of operation.

The read port data width of memory portion 1302A is limited by the total number of product term circuits 208 it contains. For example, if memory portion 1302A has a total of 128 product term circuits 208, the maximum size of the data word that may be retrieved at any one time is 128 bits because only a single SRAM cell 1140 is accessed within each product term circuit 208 to avoid the logical AND function of its output from affecting the retrieved data value. Should a user wish to register the retrieved word in macrocells 104, a further limit is placed on the maximum read port data width. For example, if each programmable AND array 200 (FIG. 4) associates with 32 macrocells 104, the maximum write port data width would be 32 bits. Should the read port data width for memory portion 1302A (whose fuse points form the SRAM array 105 in FIG. 2) be less than the number of its product term circuits 208, a Y decoder 1318 may be used to identify the pertinent product term outputs 1120 that contain the retrieved data word. Y decoder 1318 receives re-ordered address signals as split product term outputs 404 from IRP 1332 to control the selection of the proper product term outputs 1120 (representing the retrieved data word).

Note, however, the difference between FIFO memory mode and RAM mode operation. During FIFO memory mode, read counter 120 (FIG. 2) controls the addressing by read address decoder 1310 and Y decoder 1318. For example, should a 14 bit RCOUNT be produced by read counter 120, it may be formed into two 7-bit addresses to each of these decoders. Similarly, a 14-bit WCOUNT from write counter 110 may be decomposed into two 7-bit addresses to write address decoder 1314 and bit line driver 1316. During RAM mode operation, the addresses would be supplied by IRP 1332. Mode select circuits 1730, 1736, 1732, and 1734 select the proper address depending upon whether memory portion 1302A is being used in FIFO memory mode or RAM mode.

During FIFO memory mode operation, WCLK and RCLK are within the re-ordered set of control and data signals from IRP 1332. As discussed with respect to FIG. 2, write counter 110 receives WCLK and the full flag to generate the write count, WCOUNT. In turn, WCOUNT is received by write address decoder 1314 and bit line driver 1316 to identify the address within memory portion 1302A for storing the current received data word. Read counter 120 receives RCLK and the empty flag to generate the read count, RCOUNT. Read address decoder 1310 and Y decoder 1318 decodes RCOUNT to identify the address within FIFO memory portion 1302A for retrieving a stored data word according to the first-in-first-out hicarchy. In this fashion, memory portion 1302A would be fully programmable to support any combination of 1 bit, 2 bit, 4 bit, 8 bit, 16 bit, or 32 bit write port and read port data widths in either FIFO memory mode or RAM mode.

Regardless of whether memory portion 1302A is used in a FIFO memory mode or RAM mode, the read and write word widths are independent. To support such independence, the four decoders (read address decoder 1310, write address decoder 1314, bit line driver 1316, and Y decoder 1318) are each individually configurable. Any combination of ×1, ×2, ×4, ×8, ×16, or ×32 word width can be implemented. Configuration bits (not illustrated) control the configuration of the four decoders. In this configuration, the addressing scheme should ensure that the locations within memory portion 1302A as addressed during reading and writing follows a certain order. For example, if 32 bit words are being written into memory portion 1302A (through bit lines 1146), each of these words must be readable as four consecutive words from Y decoder 1318. To achieve such an order, the bits within memory portion 1302A may be assumed to be ordered linearly from 0 to 16,383 (assuming a 16K memory array such that the most significant bit (MSB) to least significant bit (LSB) for any word being written or read from memory portion 1302A maps to the physical memory array bits according to the following equation: MSB=(current address+1)*word width−1; LSB= (current address* word width). For example, if 32 bit words are being written into memory portion 1302A, the total addresses for the written words would range from 0 to 511. Consider the word written at address location 88. From the above equations, the MSB of this word maps to physical bit location (88 +1)*32−1=2,847. Similarly, the LSB of this word maps to physical bit location 88*32=2816. The remaining bits would go in order between the MSB and LSB. In this same example, assume that 8 bit words are being read out of memory portion 1302A such that the read addresses range from 0 to 2047. To read the four consecutive eight bit words corresponding to the 32 bit word written at address 88 requires reading the eight bit word at location 88*4+0=352, 88*4+1=353, 88*4+2=354, and 88*4+3=355. The least significant 8 bits map to address 352, the next significant 8 bits map to address 353, and so on. A Although the read port and data port widths are configurable, the port circuitry (for both the read and write ports) for memory portion 1302A remain unchanged regardless of the particular port configuration. Thus, for a 128-bit by 128-bit memory portion 1302A embodiment, the maximum read port width and write port width would be 128 bits each. With respect to the write port, mode select multiplexer 1352 drives a 128-bit-wide bus 1328 that couples to the one hundred and twenty eight bit lines 1146. Should bit line driver 1316 be configured for operation with a write port data width of 128 bits, the entire bus 1328 would be used. However, should bit line driver 1316 be configured for a write port operation of less than 128 bits, bus 1328 would not be used to capacity. Similarly, the 128-bit-wide bus 1327 coupling product term outputs 1120 from memory portion 1302A to Y decoder may or may not be used at full capacity depending upon the read port data width.

In the above discussion, the RAM mode has been "pseudo dual port" in that words are only written in the write port formed by bit lines 1146 and read from the read port formed from product term outputs 1120 (as controlled by the relevant decoders for both ports), corresponding to the SRAM cell 1140 described with respect to FIG. 5.

Figure 9:
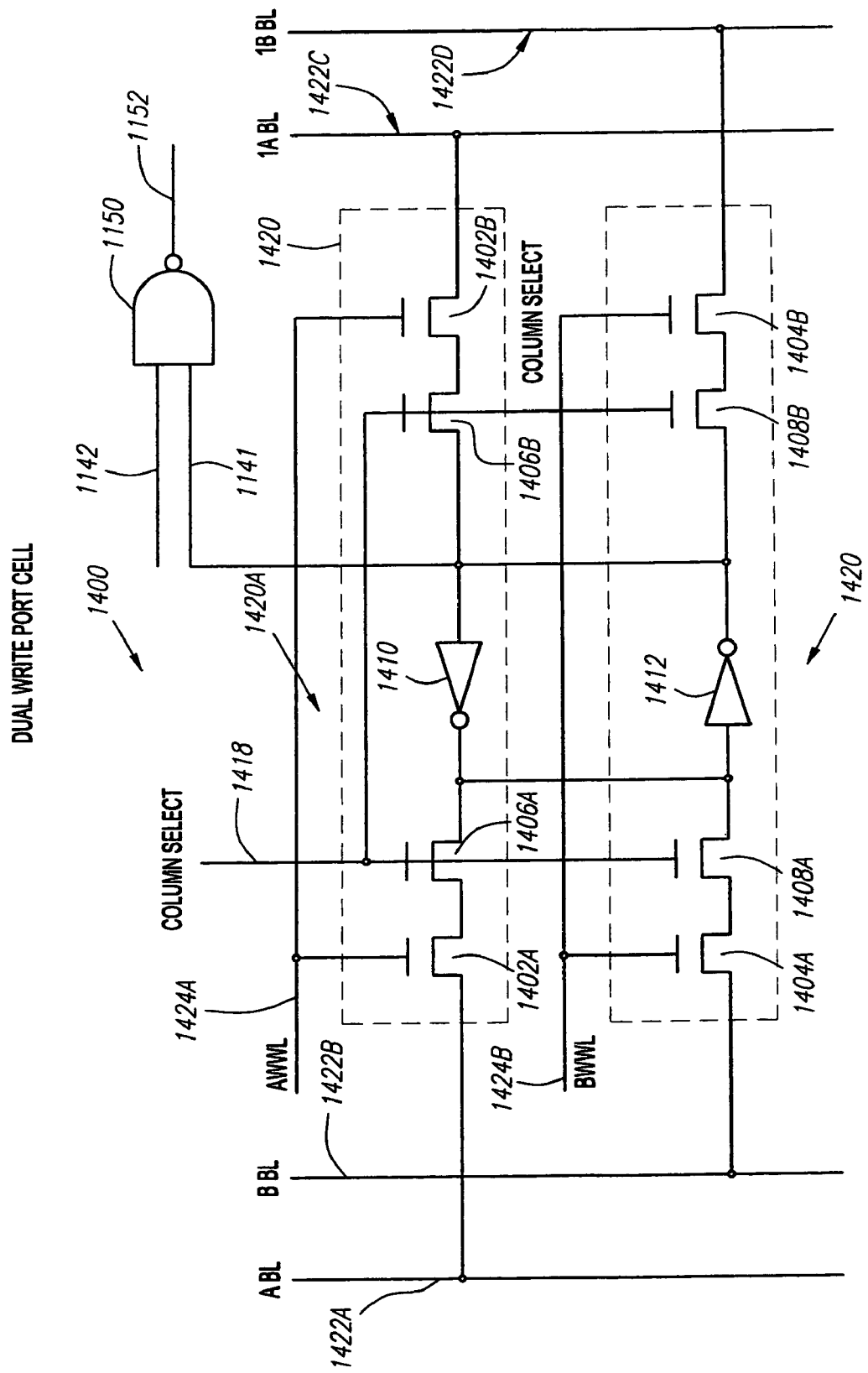
FIG. 9 illustrates a dual port memory cell that may be used to form a fuse point in the product term circuits of FIG. 4.

A true dual-port embodiment may be formed using the SRAM cell shown in FIG. 9 to form the fuse points 285 within product term circuits 208 (FIG. 4). A NAND gate 1150 controls whether a logical signal carried on line 1142 may propagate to the output line 1152 as controlled by an SRAM cell 1420 analogously as described with respect to FIG. 5. SRAM cell 1420 is formed by cross coupled inverters 1410 and 1412. SRAM cell 1420 has two sets of bits lines 1422A (and its complement 1422C) and 1422B (and its complement 1422D). The A and B designations correspond to the dual ports accessing SRAM cell 1420, respectively. Similarly, SRAM cell 1420 has two sets of word line 1424A and 1424B. These bit and word lines, in conjunction with column select line 1418, control pass transistors 1402A, 1406A, 1404A, 1408A, 1408B, 1404B, 1406B, and 1402B to program the state of SRAM cell 1420.

Figure 10:
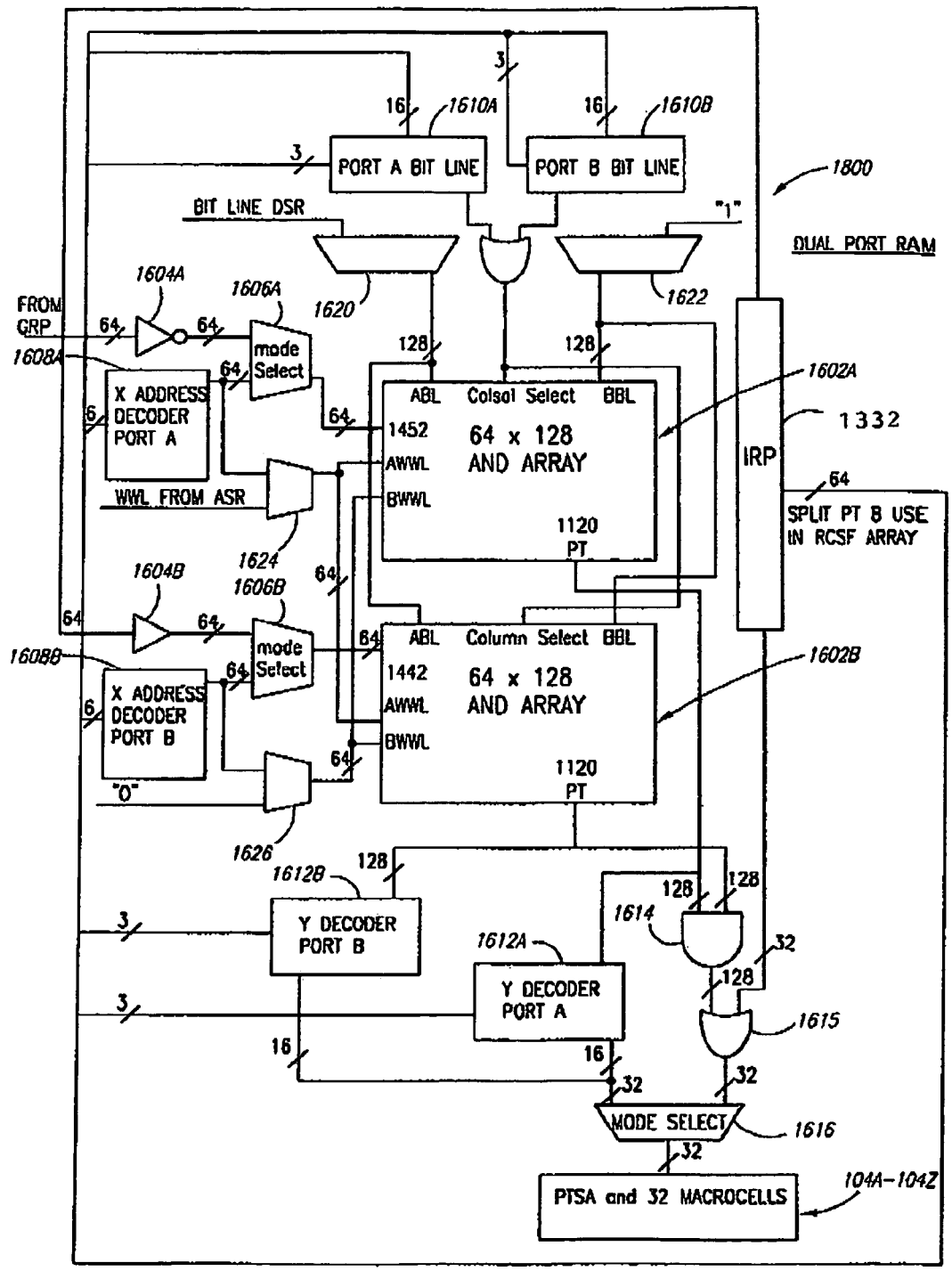
FIG. 10 illustrates a partitioning of the product term circuits in the programmable logic block of FIG. 4 to implement a dual port memory according to one embodiment of the invention.

Turning now to FIG. 10, the 128 product term circuits 208 forming memory portion 1302A discussed with respect to FIG. 7 may be split into 64 bit by 128 bit portions 1602A and 1602B implemented with SRAM cells 1420 to form a true dual-port RAM. IRP 1332 functions as discussed before to re-order the data and address inputs. The function of 64 inverters 1604A, a port A x-address decoder 1608A, a port A mode select 1606A, an array of buffers 1604B, a port B x-address decoder 1608B, a port B mode select 1606B, a port A bit line driver 1610A, a port B bit line driver 1610B, an AND array portion 1602A, another AND array portion 1602B, a port A y-address decoder 1612A, a port B y-address decoder 1612B, an array 1614 of AND gates, an array 1615 of OR gates, a mode select 1616, select circuits 1620–1626, a PTSA 202 and 32 macrocells 104 (FIG. 4) occurs analogously to that for the pseudo dual port RAM described with respect to FIG. 7. It will be appreciated that the data rate adaptation technique of the present invention may be extended to memories having greater than two ports as well.

The above-described embodiments of the present invention are merely meant to be illustrative and not limiting. For example, other types of memory cells may be used in place of SRAM memory cells to form the fuse points for a product term circuit. Moreover, a memory having data rate adaptation as disclosed herein may be implemented using a memory array that is not configured to also serve as the fuse points for a plurality of product term circuits. It will thus be obvious to those skilled in the art that various changes and modifications may be made without departing from this invention in its broader aspects. The appended claims encompass all such changes and modifications as fall within the true spirit and scope of this invention.

What is claimed is:

1. A first-in-first-out (FIFO) memory, comprising:
an array of memory cells;
a write address decoder coupled to the array, the write address decoder being configured to form a write port for the array having a programmable write port data width;
a read address decoder coupled to the array, the read address decoder being configured to form a read port for the array having a programmable read port data width;
a write counter configured to increment a write count according to the programmable write port data width, wherein the write address decoder is configured to decode the write count into a current write address for the array, and wherein the write counter increments responsive to the write clock;
a read counter configured to increment a read count according to the programmable read port data width, wherein the read address decoder is configured to decode the read count into a current read address for the array and the read counter increments responsive to a read clock; and
a flag generation module configured to assert an empty flag if the amount of data stored in the array is less than a first configurable amount and wherein the read counter is disabled from incrementing the read count if the empty flag is asserted.

2. The FIFO memory of claim 1, wherein the read port data width and the write port data width are independent.

3. The FIFO memory of claim 2, further comprising: the flag generation module is configured to assert an almost empty flag if the amount of data stored in the array is less than the first configurable amount.

4. The FIFO memory of claim 2, further comprising: wherein a flag generation module is configured to assert an almost full flag if the amount of data stored in the FIFO is greater than the first configurable amount.

5. The FIFO memory of claim 1, wherein the first configurable amount equals the read port data width.

6. A first-in-first-out (FIFO) memory comprising:
an array of memory cells;
a write address decoder coupled to the array, the write address decoder being configured to form a write port for the array having a programmable write port data width;
a read address decoder coupled to the array, the read address decoder being configured to form a read port for the array having a programmable read port data width;
a write counter configured to increment a write count according to the programmable write port data width, wherein the write address decoder is configured to decode the write count into a current write address for the array and wherein the write counter increments responsive to a write clock; and
a flag generation module configured to assert a fill flag if the amount of data stored in the memory array exceeds a first configurable amount and wherein the write counter is disabled from incrementing the write count if the full flag is asserted.

7. The FIFO memory of claim 6, wherein the first configurable amount is less than or equal to the capacity of the array minus the write port data width.

8. A first-in-first-out (FIFO) memory comprising:
an array of memory cells;
a write address decoder coupled to the array, the write address decoder being configured to form a write port for the array having a programmable write port data width;
a read address decoder coupled to the array, the read address decoder being configured to form a read port for the array having a programmable read port data width a write counter configured to increment a write count according to the programmable write port data width, wherein the write address decoder is configured to decode the write count into a current write address for the array and wherein the write counter increments responsive to a write clock;
a write counter configured to increment a write count according to the programmable write port data width, wherein the write address decoder is configured to decode the write count into a current write address for the array, and wherein the write counter increments responsive to a write clock; and
a read counter configured to increment a read count according to the programmable read port data width, wherein the read address decoder is configured to decode the read count into a current read address for the array and the read counter increments responsive to a read clock, wherein the capacity of the array is N bits, and the write counter and read counter are each configured to count modulo 2N.

9. A programmable block, comprising:
a plurality of product term circuits, wherein each product term circuit is configured to provide a product term output based inputs selected from a set of input signals, each product term circuit including a plurality of memory cells Arranged corresponding to the set of input signals such that each memory cell controls whether its corresponding input signal will affect the product term output, and
wherein a subset of the product term circuits are configurable in a FIFO mode to form a FIFO memory array, and wherein the product term output from each of the product term circuits in the subset corresponds to a bit stored in one of its memory cells if configured in the FIFO mode, the FIFO memory array including:

a write counter configured to increment a write count according to a programmable write port data width, wherein the write count corresponds to a current write address in the FIFO memory array and the write counter increments responsive to a write clock; and a read counter configured to increment a read count according to a programmable read port data width, wherein the read count corresponds to a current read address in the FIFO memory array and the read counter increments responsive to a read clock.

10. The programmable block of claim 9, wherein the read port data width and the write port data width are independent.

11. The programmable block of claim 9, further comprising:

a flag generation module configured to assert an empty flag if the amount of data stored in the FIFO memory array is less than a first configurable amount, and wherein the read counter is disabled from incrementing the read count if the empty flag is asserted.

12. The programmable block of claim 9, further comprising:

a flag generation module configured to assert a full-flag if the amount of data stored in the FIFO memory array exceeds a first configurable amount, and wherein the write counter is disabled from incrementing the write count if the fill flag is asserted.

13. The programmable block of claim 9, further comprising:

a read decoder configured to decode the read count to identify the current read address; and a write decoder configured to decode the write count to identify the current write address.

14. A memory, comprising:

an array of memory cells having a reading port and a writing port;

means for writing words of a first programmable width into the writing port; and means for reading words of a second programmable width from the reading port, wherein the first programmable width for the written words is an integer multiple M of the second programmable width for the read words, and wherein the means for writing words and the means for reading words are each configured to ensure that each written word corresponds to a successive plurality of M read words.

15. The memory of claim 14, wherein the first programmable width and the second programmable width are independent.

16. The memory of claim 14, wherein the first programmable width for the written words ranges from 1 bit to 128 bits, and wherein the second programmable width for the read words ranges from 1 bit to 128 bits.

17. The memory of claim 14, wherein the second programmable width for the read words is an integer multiple M of the first programmable width for the written words, and wherein the means for writing words and the means for reading words are each configured to ensure that each read word corresponds to a successive plurality of M written words.

18. The memory of claim 14, wherein the array of memory cells is an array of SRAM memory cells.

* * * * *